US012757791B2

(12) United States Patent
Seo et al.

(10) Patent No.: US 12,757,791 B2
(45) Date of Patent: Oct. 6, 2026

(54) DISPLAY DEVICE THAT SELF ASSEMBLES LIGHT EMITTING DIODES

(71) Applicant: LG Display Co., Ltd., Seoul (KR)

(72) Inventors: Daeyoung Seo, Paju-si (KR); Hun Jang, Paju-si (KR)

(73) Assignee: LG Display Co., Ltd. (KR)

(*) Notice: Subject to any disclaimer, the term of this patent is extended or adjusted under 35 U.S.C. 154(b) by 340 days.

(21) Appl. No.: 18/376,067

(22) Filed: Oct. 3, 2023

(65) Prior Publication Data

US 2024/0128243 A1 Apr. 18, 2024

(30) Foreign Application Priority Data

Oct. 18, 2022 (KR) ........................ 10-2022-0133829

(51) Int. Cl.
*H10W 90/00* (2026.01)
*H10H 20/831* (2025.01)
*H10H 20/857* (2025.01)

(52) U.S. Cl.
CPC ........ *H10W 90/00* (2026.01); *H10H 20/8314* (2025.01); *H10H 20/857* (2025.01)

(58) Field of Classification Search
CPC . H10W 90/00; H10H 20/8314; H10H 20/857; H10H 29/142; H10H 20/83; H10H 20/8506
See application file for complete search history.

(56) References Cited

U.S. PATENT DOCUMENTS

| | | | |
|---|---|---|---|
| 2013/0126933 A1 | 5/2013 | Erchak et al. | |
| 2017/0358563 A1 | 12/2017 | Cho et al. | |
| 2022/0399313 A1 | 12/2022 | Park et al. | |
| 2023/0015395 A1 | 1/2023 | Lee et al. | |
| 2023/0084381 A1 | 3/2023 | Kim et al. | |

FOREIGN PATENT DOCUMENTS

| | | | |
|---|---|---|---|
| KR | 10-2017-0050371 A | 5/2017 | |
| KR | 10-2019-0085892 | 7/2019 | |
| KR | 20190118992 A * | 10/2019 | ............ H10W 90/00 |

(Continued)

OTHER PUBLICATIONS

Bong, KR10-2020-0026683, machine translation Mar. 2020 (Year: 2020).*

(Continued)

*Primary Examiner* — Tracie Y Green
(74) *Attorney, Agent, or Firm* — Fish & Richardson P.C.

(57) ABSTRACT

A display device includes a substrate in which a plurality of sub pixels is defined; a first lower assembly electrode disposed in each of the plurality of sub pixels; an interlayer insulating layer disposed below the first lower assembly electrode; a second lower assembly electrode disposed below the interlayer insulating layer; a passivation layer disposed on the first lower assembly electrode and the second lower assembly electrode; and a first upper assembly electrode and a second upper assembly electrode which are disposed on the passivation layer and are disposed to be spaced apart from each other, and a minimum interval of the first lower assembly electrode and the second lower assembly electrode is smaller than a minimum interval of the first upper assembly electrode and the second upper assembly electrode on the plane.

10 Claims, 13 Drawing Sheets

(56) References Cited

FOREIGN PATENT DOCUMENTS

| | | | | | |
|---|---|---|---|---|---|
| KR | 10-2020-0026681 | | | 3/2020 | |
| KR | 10-2020-0026838 | | | 3/2020 | |
| KR | 20200026683 | A | * | 3/2020 | ....... H01L 21/67144 |
| KR | 20200030514 | A | * | 3/2020 | .............. H10P 72/74 |
| KR | 20210086816 | A | * | 7/2021 | ............ H10W 90/00 |
| WO | WO 2021/117956 | A1 | | 6/2021 | |
| WO | 2023/033572 | A1 | | 3/2023 | |
| WO | 2023/157987 | A1 | | 8/2023 | |
| WO | WO 2023/182538 | A1 | | 9/2023 | |
| WO | 2024/019571 | A1 | | 1/2024 | |

OTHER PUBLICATIONS

Jae, KR10-2020-0030514, machine translation ,Mar. 2020 (Year: 2020).*
Ui, KR10-2021-0086816, machine translation, Jul. 2021 (Year: 2021).*
WO2023/182538, machine translation, 2023 (Year: 2023).*
Moon, KR10-2019-0118992, Machine Translation, 2019 (Year: 2019).*
Office Action in German Application No. 102023128524.6, mailed on Sep. 22, 2025, 7 pages (with English translation).
UKIPO Combined Search and Examination report dated Mar. 28, 2024 issued in Patent Application No. GB2315905.6 (6 pages).
Office Action in United Kingdom Appln. No. GB2315905.6, mailed on Jan. 31, 2025, 4 pages.

* cited by examiner

DISPLAY DEVICE THAT SELF ASSEMBLES LIGHT EMITTING DIODES

CROSS-REFERENCE TO RELATED APPLICATION

This application claims the priority of Korean Patent Application No. 10-2022-0133829 filed on Oct. 18, 2022, which is hereby incorporated by reference in its entirety.

BACKGROUND

Field of the Disclosure

The present disclosure relates to a display device, and more particularly, to a display device which self-assembles a light emitting diode (LED).

Description of the Background

As display devices which are used for a monitor of a computer, a television, or a cellular phone, there are an organic light emitting display (OLED) device which is a self-emitting device, a liquid crystal display (LCD) device which requires a separate light source, and the like.

An applicable range of the display device is diversified to personal digital assistants as well as monitors of computers and televisions and a display device with a large display area and a reduced volume and weight is being studied.

Further, in recent years, a display device including an LED is attracting attention as a next generation display device. Since the LED is formed of an inorganic material, rather than an organic material, reliability is excellent so that a lifespan thereof is longer than that of the liquid crystal display device or the organic light emitting display device. Further, the LED has a fast lighting speed, excellent luminous efficiency, and a strong impact resistance so that stability is excellent and an image having a high luminance may be displayed.

SUMMARY

Accordingly, the present disclosure is directed to a display device that substantially achieves the desires described above.

More specifically, the present disclosure is to provide a display device with an improved self-assembly rate.

The present disclosure is also to provide a display device which minimizes an interval between assembly electrodes to increase an intensity of an electric field to self-assemble a light emitting diode.

The present disclosure is also to provide a display device which forms an asymmetric lower assembly electrode to increase an intensity of the electric field and disposes a symmetric upper assembly electrode to compensate for an imbalanced electric field due to the asymmetric lower assembly electrode.

The present disclosure is also to provide a display device which minimizes an unnecessary electric field in an area excluding a correct position in which a light emitting diode is self-assembled to improve an assembly rate of the light emitting diode.

Further, the present disclosure is to provide a display device which maximizes an intensity of an electric field in a correct position in which a light emitting diode is self-assembled to improve an assembly rate of the light emitting diode.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings. The present disclosure are not limited to the above-mentioned and other features, which are not mentioned above, may be clearly understood by those skilled in the art from the following descriptions.

To achieve these and other advantages and in accordance with the present disclosure, as embodied and broadly described, a display device includes a substrate in which a plurality of sub pixels is defined; a first lower assembly electrode disposed in each of the plurality of sub pixels; an interlayer insulating layer disposed below the first lower assembly electrode; a second lower assembly electrode disposed below the interlayer insulating layer and disposed in each of the plurality of sub pixels; a passivation layer disposed on the first lower assembly electrode and the second lower assembly electrode; and a first upper assembly electrode and a second upper assembly electrode which are disposed on the passivation layer and are disposed to be spaced apart from each other, and a minimum interval of the first lower assembly electrode and the second lower assembly electrode is smaller than a minimum interval of the first upper assembly electrode and the second upper assembly electrode on the plane. Accordingly, the first lower assembly electrode and the second lower assembly electrode with a narrower interval are further disposed to increase the intensity of the electric field for self-assembling the light emitting diode and improve the self-assembly rate of the light emitting diode.

In another aspect of the present disclosure, a display device includes a lower assembly electrode which is disposed on a substrate and includes a first lower assembly electrode and a second lower assembly electrode spaced apart from each other; and an upper assembly electrode which is disposed on the lower assembly electrode and includes a first upper assembly electrode and a second upper assembly electrode spaced apart from each other. The first lower assembly electrode and the second lower assembly electrode are disposed on different planes to form an asymmetric structure and the first upper assembly electrode and the second upper assembly electrode are disposed on the same plane to form a symmetric structure. Accordingly, a symmetric upper assembly electrode compensates for an imbalanced electric field due to the asymmetric lower assembly electrode to improve the self-assembly rate of the light emitting diode.

Other detailed matters of the exemplary aspects are included in the detailed description and the drawings.

According to the present disclosure, a self-assembly rate of the light emitting diode is improved to increase a yield of the display device.

According to the present disclosure, one pair of assembly electrodes are formed with an interval smaller than a minimum interval which may be implemented by the process equipment to increase an intensity of an electric field for self-assembling the light emitting diode.

According to the present disclosure, a symmetric upper assembly electrode compensates for an imbalanced electric field due to the asymmetric lower assembly electrode to stably self-assemble the light emitting diode.

According to the present disclosure, the intensity of the electric field is maximized in the correct position in which the light emitting diode is self-assembled to improve the assembly rate.

According to the present disclosure, an intensity of the electric field is weakened in a position other than the correct position in which the light emitting diode is self-assembled to more easily self-assemble the light emitting diode in the correct position.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
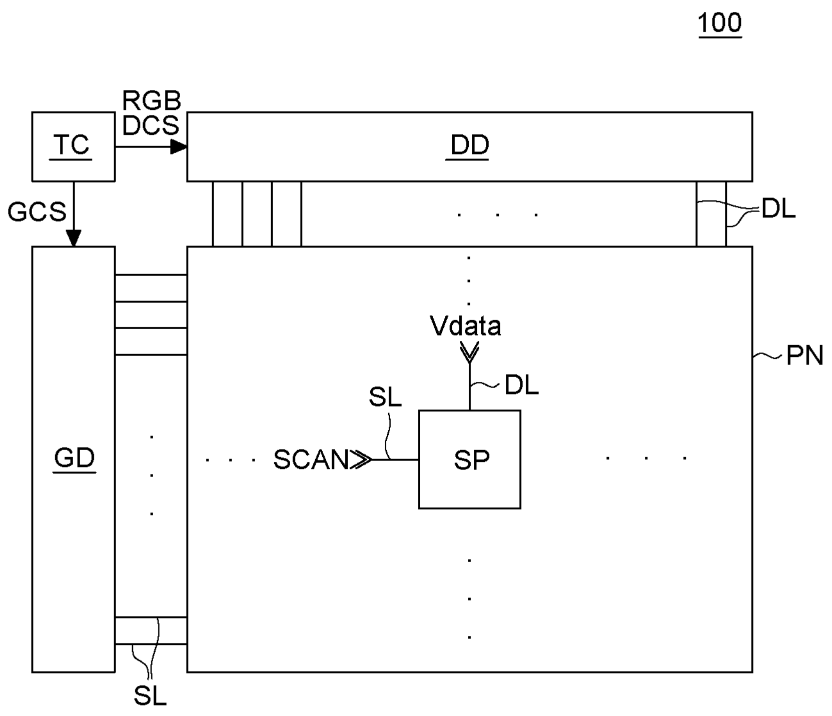
FIG. 1 is a schematic diagram of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as “including,” “having,” and “consist of” used herein are generally intended to allow other components to be added unless the terms are used with the term “only.” Any references to singular may include plural unless expressly stated otherwise.

Components are interpreted to include an ordinary error range even if not expressly stated.

When the position relation between two parts is described using the terms such as “on,” “above,” “below,” and “next,” one or more parts may be positioned between the two parts unless the terms are used with the term “immediately” or “directly.”

When an element or layer is disposed “on” another element or layer, another layer or another element may be interposed directly on the other element or therebetween.

Although the terms “first,” “second,” and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, a display device according to exemplary aspects of the present disclosure will be described in detail with reference to accompanying drawings.

FIG. 1 is a schematic diagram of a display device according to an exemplary aspect of the present disclosure. In FIG. 1, for the convenience of description, among various components of the display device 100, only a display panel PN, a gate driver GD, a data driver DD, and a timing controller TC are illustrated.

Referring to FIG. 1, the display device 100 includes a display panel PN including a plurality of sub pixels SP, a gate driver GD and a data driver DD which supply various signals to the display panel PN, and a timing controller TC which controls the gate driver GD and the data driver DD.

The display panel PN is a configuration which displays images to the user and includes the plurality of sub pixels SP. In the display panel PN, the plurality of scan lines SL and the plurality of data lines DL intersect each other and the plurality of sub pixels SP is connected to the scan lines SL and the data lines DL, respectively. In addition, even though it is not illustrated in the drawing, each of the plurality of sub pixels SP is connected to a high potential power line, a low potential power line VSS, reference line, and the like.

The plurality of sub pixels SP is a minimum unit which configures a screen and each of the plurality of sub pixels SP may include a light emitting diode and a pixel circuit for driving the light emitting diode. The plurality of light emitting diodes may be defined in different manners depending on the type of the display panel PN. For example, when the display panel PN is an inorganic light emitting display panel, the light emitting diode may be a light emitting diode (LED) or a micro light emitting diode (LED).

The gate driver GD supplies a plurality of scan signals SCAN to a plurality of scan lines SL in accordance with a plurality of gate control signals GCS supplied from the timing controller TC. Even though in FIG. 1, it is illustrated that one gate driver GD is disposed to be spaced apart from one side of the display panel PN, the number of the gate drivers GD and the placement thereof are not limited thereto.

The data driver DD converts image data RGB input from the timing controller TC in accordance with a plurality of data control signals DCS supplied from the timing controller TC into a data voltage Vdata using a reference gamma voltage. The data driver DD may supply the converted data voltage Vdata to the plurality of data lines DL.

The timing controller TC aligns image data RGB input from the outside to supply the image data to the data driver DD. The timing controller TC may generate a gate control signal GCS and a data control signal DCS using synchronization signals input from the outside, such as a dot clock signal, a data enable signal, and horizontal/vertical synchronization signals. The timing controller TC supplies the generated gate control signal GCS and data control signal DCS to the gate driver GD and the data driver DD, respectively, to control the gate driver GD and the data driver DD.

Hereinafter, a plurality of sub pixels SP of a display panel PN of a display device 100 according to an exemplary aspect of the present disclosure will be described in more detail.

Figure 2:
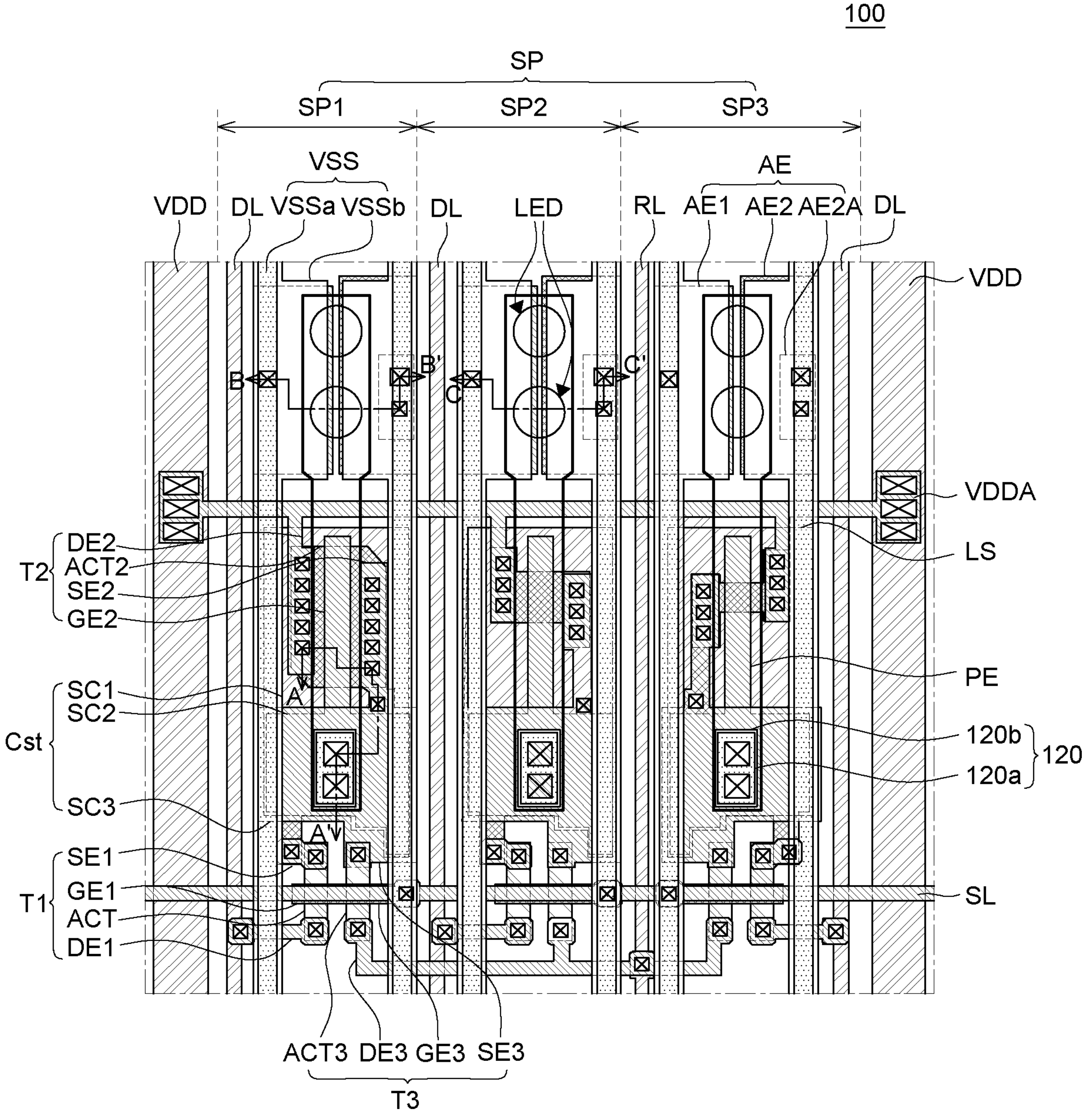
FIG. 2 is an enlarged plan view of a display device according to an exemplary aspect of the present disclosure.
Figure 3:
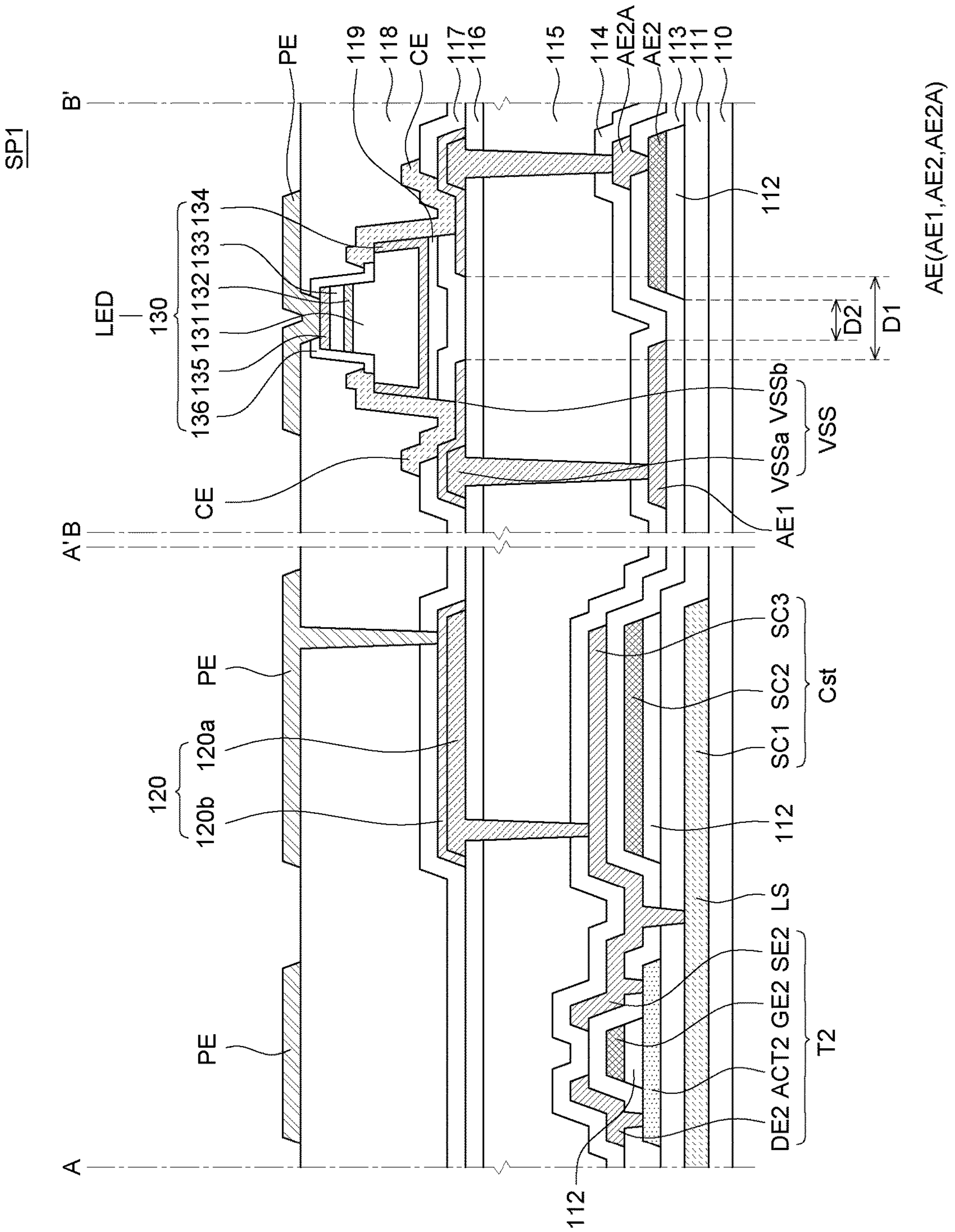
FIG. 3 is a cross-sectional view taken along lines A-A' and B-B' of FIG. 2.
Figure 4:
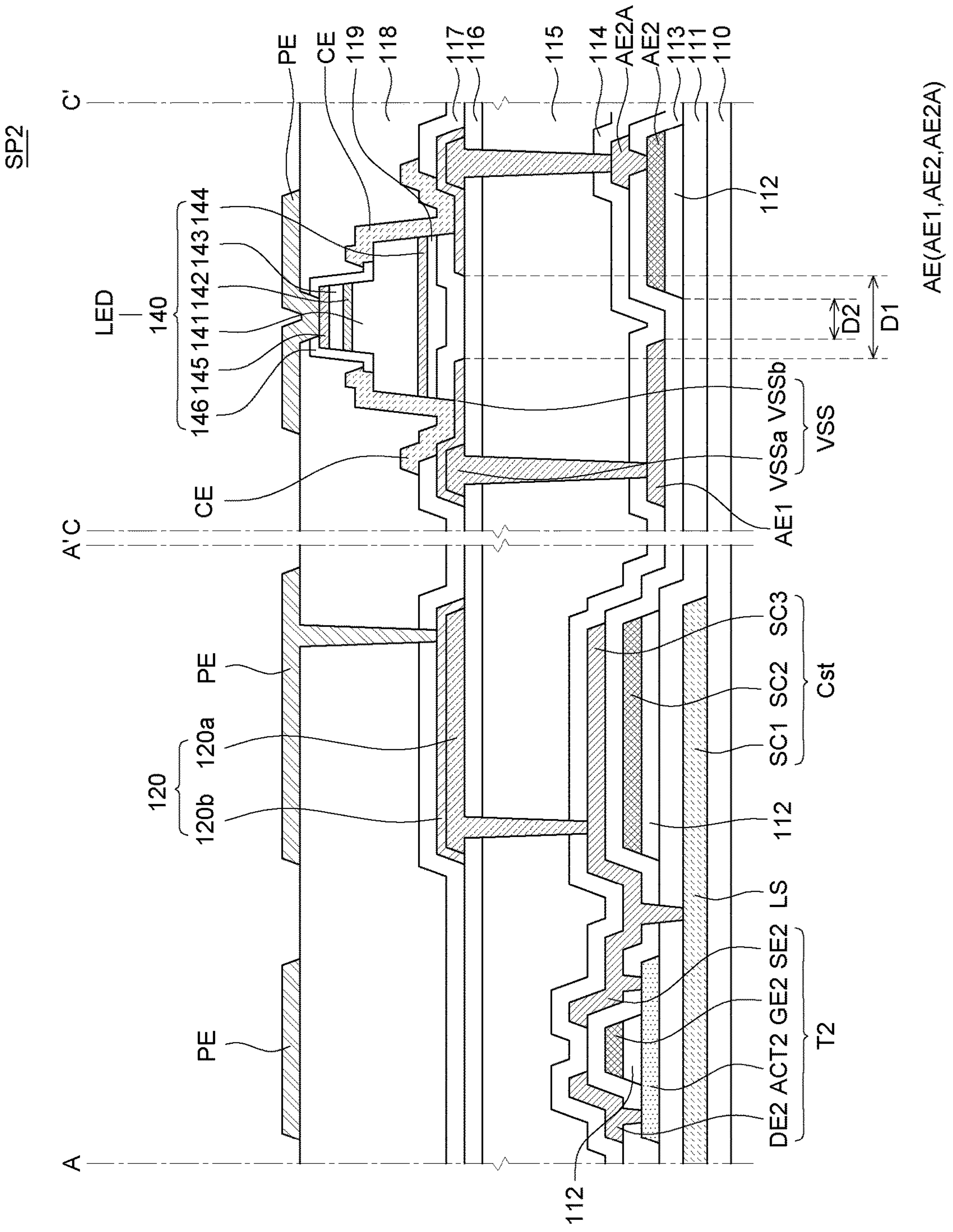
FIG. 4 is a cross-sectional view taken along lines A-A' and C-C' of FIG. 2.

FIG. 2 is an enlarged plan view of a display device according to an exemplary aspect of the present disclosure. FIG. 3 is a cross-sectional view taken along lines A-A' and B-B' of FIG. 2. FIG. 4 is a cross-sectional view taken along lines A-A' and C-C' of FIG. 2. Referring to FIG. 2, each of the plurality of sub pixels SP includes a first transistor T1, a second transistor T2, a third transistor T3, a storage capacitor Cst, and one or more light emitting diodes LED. In FIG. 2, for the convenience of description, the hatching of a clad layer VSSb, a pixel electrode PE, and a light emitting diode LED is omitted and the contact electrode CE is not illustrated.

Referring to FIGS. 2 and 3, the plurality of sub pixels SP includes a first sub pixel SP1, a second sub pixel SP2, and a third sub pixel SP3. Each of the first sub pixel SP1, the second sub pixel SP2, and the third sub pixel SP3 includes a light emitting diode LED and a circuit to independently emit light. For example, the first sub pixel SP1 is a red sub pixel, the second sub pixel SP2 is a green sub pixel, and the third sub pixel SP3 is a blue sub pixel, but it is not limited thereto.

The display panel PN includes a substrate 110, a buffer layer 111, a gate insulating layer 112, an interlayer insulating layer 113, a first passivation layer 114, a first planarization layer 115, a second passivation layer 116, a third passivation layer 117, an adhesive layer 119, and a second planarization layer 118.

First, the substrate 110 is a component for supporting various components included in the display device 100 and may be formed of an insulating material. For example, the substrate 110 may be formed of glass, resin, or the like. Further, the substrate 110 may be configured to include polymer or plastics or may be formed of a material having flexibility.

A high potential power line VDD, a plurality of data lines DL, a reference line RL, a light shielding layer LS, and a first capacitor electrode SC1 are disposed on the substrate 110.

The high potential power line VDD is a wiring line which transmits a high potential power voltage to each of the plurality of sub pixels SP. The plurality of high potential power lines VDD may transmit the high potential power voltage to the second transistor T2 of each of the plurality of sub pixels SP. The high potential power line VDD may extend along a column direction between the plurality of sub pixels SP. For example, the high potential power line VDD may be disposed to extend along a column direction between the first sub pixel SP1 and the third sub pixel SP3. The high potential power line VDD may transmit a high potential power voltage to each of the plurality of sub pixels SP disposed in the row direction through an auxiliary high potential power line VDDA to be described below.

The plurality of data lines DL is wiring lines which transmit the data voltage Vdata to each of the plurality of sub pixels SP. The plurality of data lines DL may be connected to the first transistor T1 of each of the plurality of sub pixels SP. The plurality of data lines DL may extend along a column direction between the plurality of sub pixels SP. For example, a data line DL which extends between the first sub pixel SP1 and the high potential power line VDD in the column direction may transmit a data voltage Vdata to the first sub pixel SP1. A data line DL disposed between the first sub pixel SP1 and the second sub pixel SP2 may transmit a data voltage Vdata to the second sub pixel SP2. Further, a data line DL disposed between the third sub pixel SP3 and the high potential power line VDD may transmit a data voltage Vdata to the third sub pixel SP3.

The reference line RL is a wiring line which transmits a reference voltage to each of the plurality of sub pixels SP. The reference line RL may be connected to the third transistor T3 of each of the plurality of sub pixels SP. The reference line RL may extend along a column direction between the plurality of sub pixels SP. For example, the reference line RL may be disposed to extend along a column direction between the second sub pixel SP2 and the third sub pixel SP3. A third drain electrode DE3 of the third transistor T3 of each of the first sub pixel SP1, the second sub pixel SP2, and the third sub pixel SP3 adjacent to the reference line RL extends in the row direction to be electrically connected to the reference line RL.

The light shielding layer LS is disposed on the substrate 110 in each of the plurality of sub pixels SP. The light shielding layer LS blocks light which is incident to the transistor from the lower portion of the substrate 110 to minimize a leakage current. For example, the light shielding layer LS may block light incident to a second active layer ACT2 of the second transistor T2 which is a driving transistor.

In each of the plurality of sub pixels SP, a first capacitor electrode SC1 is disposed on the substrate 110. The first capacitor electrode SC1 may form a storage capacitor Cst together with the other capacitor electrode. The first capacitor electrode SC1 may be integrally formed with the light shielding layer LS.

A buffer layer 111 is disposed on the high potential power line VDD, the plurality of data lines DL, the reference line RL, the light shielding layer LS, and the first capacitor electrode SC1. The buffer layer 111 may reduce permeation of moisture or impurities through the substrate 110. The buffer layer 111 may comprise a single layer or a double layer of silicon oxide SiOx or silicon nitride SiNx, but is not limited thereto. However, the buffer layer 111 may be omitted depending on a type of substrate 110 or a type of transistor, but is not limited thereto.

First, the first transistor T1 is disposed on the buffer layer 111 in each of the plurality of sub pixels SP. The first transistor T1 is a transistor which transmits a data voltage Vdata to the second gate electrode GE2 of the second transistor T2. The first transistor T1 may be turned on by a scan signal SCAN from the scan line SL and a data voltage Vdata from the data line DL may be transmitted to the second gate electrode GE2 of the second transistor T2 through the turned-on first transistor T1. Accordingly, the first transistor T1 may be referred to as a switching transistor.

The first transistor T1 includes a first active layer ACT1, a first gate electrode GE1, a first source electrode SE1, and a first drain electrode DE1.

The first active layer ACT1 is disposed on the buffer layer 111. The first active layer ACT1 may be formed of a semiconductor material such as an oxide semiconductor, amorphous silicon, or polysilicon, but is not limited thereto.

The gate insulating layer 112 is disposed on the first active layer ACT1. The gate insulating layer 112 is an insulating layer which insulates the first active layer ACT1 from the first gate electrode GE1 and may comprise a single layer or a double layer of silicon oxide (SiOx) or silicon nitride (SiNx), but is not limited thereto.

The first gate electrode GE1 is disposed on the gate insulating layer 112. The first gate electrode GE1 may be electrically connected to the scan line SL. The first gate electrode GE1 may comprise a conductive material, such as copper (Cu), aluminum (Al), molybdenum (Mo), nickel (Ni), titanium (Ti), chrome (Cr), or an alloy thereof, but is not limited thereto.

The interlayer insulating layer 113 is disposed on the first gate electrode GE1. A contact hole is formed in the interlayer insulating layer 113 to allow each of the first source electrode SE1 and the first drain electrode DE1 to be connected to the first active layer ACT1. The interlayer insulating layer 113 is an insulating layer which protects components below the interlayer insulating layer 113 and may comprise a single layer or a double layer of silicon oxide SiOx or silicon nitride SiNx, but is not limited thereto.

A first source electrode SE1 and a first drain electrode DE1 which are electrically connected to the first active layer ACT1 are disposed on the interlayer insulating layer 113. The first drain electrode DE1 may be connected to the data line DL and the first active layer ACT1 and the first source electrode SE1 may be connected to the first active layer ACT1 and the second gate electrode GE2 of the second transistor T2. The first source electrode SE1 and the first drain electrode DE1 may comprise conductive material, such as copper (Cu), aluminum (Al), molybdenum (Mo), nickel (Ni), titanium (Ti), and chrome (Cr), or an alloy thereof, but are not limited thereto.

The second transistor T2 is disposed on the buffer layer 111 in each of the plurality of sub pixels SP. The second transistor T2 is a transistor which supplies a driving current to the light emitting diode LED. The second transistor T2 is turned on to control the driving current flowing to the light emitting diode LED. Accordingly, the second transistor T2 which controls the driving current may be referred to as a driving transistor.

The second transistor T2 includes a second active layer ACT2, a second gate electrode GE2, a second source electrode SE2, and a second drain electrode DE2.

The second active layer ACT2 is disposed on the buffer layer 111. The second active layer ACT2 may be formed of a semiconductor material such as an oxide semiconductor, amorphous silicon, or polysilicon, but is not limited thereto.

The gate insulating layer 112 is disposed on the second active layer ACT2. The second gate electrode GE2 is disposed on the gate insulating layer 112. The second gate electrode GE2 may be electrically connected to the first source electrode SE1 of the first transistor T1. The second gate electrode GE2 may comprise conductive material, such as copper (Cu), aluminum (Al), molybdenum (Mo), nickel (Ni), titanium (Ti), chrome (Cr), or an alloy thereof, but is not limited thereto.

The interlayer insulating layer 113 is disposed on the second gate electrode GE2. The second source electrode SE2 and the second drain electrode DE2 which are electrically connected to the second active layer ACT2 are disposed on the interlayer insulating layer 113. The second drain electrode DE2 may be electrically connected to the second active layer ACT2 and the high potential power line VDD and the second source electrode SE2 may be electrically connected to the second active layer ACT2 and the light emitting diode LED. The second source electrode SE2 and the second drain electrode DE2 may comprise conductive material, such as copper (Cu), aluminum (Al), molybdenum (Mo), nickel (Ni), titanium (Ti), chrome (Cr), or an alloy thereof, but are not limited thereto.

The third transistor T3 is disposed on the buffer layer 111 in each of the plurality of sub pixels SP. The third transistor T3 is a transistor for compensating for a threshold voltage of the second transistor T2. The third transistor T3 is connected between the second source electrode SE2 of the second transistor T2 and the reference line RL. The third transistor T3 is turned on to transmit the reference voltage to the second source electrode SE2 of the second transistor T2 to sense a threshold voltage of the second transistor T2. Accordingly, the third transistor T3 which senses a characteristic of the second transistor T2 may be referred to as a sensing transistor.

The third transistor T3 includes a third active layer ACT3, a third gate electrode GE3, a third source electrode SE3, and a third drain electrode DE3.

The third active layer ACT3 is disposed on the buffer layer 111. The third active layer ACT3 may be formed of a semiconductor material such as an oxide semiconductor, amorphous silicon, and polysilicon, but is not limited thereto.

The gate insulating layer 112 is disposed on the third active layer ACT3 and the third gate electrode GE3 is disposed on the gate insulating layer 112. The third gate electrode GE3 may be electrically connected to the scan line SL. The third gate electrode GE3 may comprise conductive material, such as copper (Cu), aluminum (Al), molybdenum (Mo), nickel (Ni), titanium (Ti), chrome (Cr), or an alloy thereof, but is not limited thereto.

The interlayer insulating layer 113 is disposed on the third gate electrode GE3. The third source electrode SE3 and the third drain electrode DE3 which are electrically connected to the third active layer ACT3 are disposed on the interlayer insulating layer 113. The third drain electrode DE3 may be electrically connected to the third active layer ACT3 and the reference line RL and the third source electrode SE3 may be electrically connected to the third active layer ACT3 and the second source electrode SE2 of the second transistor T2. The third source electrode SE3 and the third drain electrode DE3 may comprise conductive material, such as copper (Cu), aluminum (Al), molybdenum (Mo), nickel (Ni), titanium (Ti), chrome (Cr), or an alloy thereof, but are not limited thereto.

Next, the second capacitor electrode SC2 is disposed on the gate insulating layer 112. The second capacitor electrode SC2 is one of electrodes which form the storage capacitor Cst and may be disposed to overlap the first capacitor electrode SC1. The second capacitor electrode SC2 is integrally formed with the second gate electrode GE2 of the second transistor T2 to be electrically connected to the second gate electrode GE2. The first capacitor electrode SC1 and the second capacitor electrode SC2 may be disposed to be spaced apart from each other with the buffer layer 111 and the gate insulating layer 112 therebetween.

The plurality of scan lines SL, the auxiliary high potential power line VDDA, and a third capacitor electrode SC3 are disposed on the interlayer insulating layer 113.

First, the scan line SL is a wiring line which transmits the scan signal SCAN to each of the plurality of sub pixels SP. The scan line SL may extend in the row direction while traversing the plurality of sub pixels SP. The scan line SL may be electrically connected to the first gate electrode GE1 of the first transistor T1 and the third gate electrode GE3 of the third transistor T3 of each of the plurality of sub pixels SP.

The auxiliary high potential power line VDDA is disposed on the interlayer insulting layer 113. The auxiliary high potential power line VDDA extends in the row direction to traverse the plurality of sub pixels SP. The auxiliary high potential power line VDDA may be electrically connected to the high potential power line VDD extending in the column direction and the second drain electrode DE2 of the second transistor T2 of each of the plurality of sub pixels SP disposed along the row direction.

The third capacitor electrode SC3 is disposed on the interlayer insulating layer 113. The third capacitor electrode SC3 is an electrode which forms the storage capacitor Cst and may be disposed to overlap the first capacitor electrode SC1 and the second capacitor electrode SC2. The third capacitor electrode SC3 is integrally formed with the second source electrode SE2 of the second transistor T2 to be electrically connected to the second source electrode SE2. The second source electrode SE2 may be electrically connected to the first capacitor electrode SC1 through a contact hole formed in the interlayer insulating layer 113 and the buffer layer 111. Therefore, the first capacitor electrode SC1 and the third capacitor electrode SC3 may be electrically connected to the second source electrode SE2 of the second transistor T2.

The storage capacitor Cst stores a potential difference between the second gate electrode GE2 and the second source electrode SE2 of the second transistor T2 while the light emitting diode LED emits light, so that a constant current may be supplied to the light emitting diode LED. The storage capacitor Cst includes the first capacitor electrode SC1, the second capacitor electrode SC2, and the third capacitor electrode SC3 to store a voltage between the second gate electrode GE2 and the second source electrode SE2 of the second transistor T2. The first capacitor electrode SC1 is formed on the substrate 110 and is connected to the second source electrode SE2 and the second capacitor electrode SC2 is formed on the buffer layer 111 and the gate insulating layer 112 and is connected to the second gate electrode GE2. The third capacitor electrode SC3 is formed on the interlayer insulating layer 113 and is connected to the second source electrode SE2.

The first passivation layer 114 is disposed on the first transistor T1, the second transistor T2, the third transistor T3, and the storage capacitor Cst. The first passivation layer 114 is an insulating layer which protects components below the first passivation layer 114 and may comprise a single layer or a double layer of silicon oxide SiOx or silicon nitride SiNx, but is not limited thereto.

The first planarization layer 115 is disposed on the first passivation layer 114. The first planarization layer 115 may planarize an upper portion of the substrate 110 on which the plurality of transistors T1, T2, and T3 and the storage capacitor Cst are disposed. The first planarization layer 115 may comprise a single layer or a double layer, and for example, may be formed of photoresist or an acrylic organic material, but is not limited thereto.

The second passivation layer 116 is disposed on the first planarization layer 115. The second passivation layer 116 is an insulating layer which protects components below the second passivation layer 116 and may comprise a single layer or a double layer of silicon oxide SiOx or silicon nitride SiNx, but is not limited thereto.

A connection electrode 120 and a plurality of low potential power lines VSS are disposed on the second passivation layer 116.

First, the connection electrode 120 is disposed in each of the plurality of sub pixels SP. The connection electrode 120 is an electrode which electrically connects the second transistor T2 and the pixel electrode PE. The connection electrode 120 may be electrically connected to the second source electrode SE2 which also serves as the third capacitor electrode SC3 through a contact hole formed in the second passivation layer 116, the first planarization layer 115, and the first passivation layer 114.

The connection electrode 120 may have a double-layered structure formed by a first connection layer 120*a* and a second connection layer 120*b*. The first connection layer 120*a* is disposed on the second passivation layer 116 and the second connection layer 120*b* covers the first connection layer 120*a*. The second connection layer 120*b* may be disposed to enclose all a top surface and side surfaces of the first connection layer 120*a*. The second connection layer 120*b* is formed of a material which is more resistant to corrosion than the first connection layer 120*a* so that when the display device 100 is manufactured, the short defect due to the migration between the first connection layer 120*a* and the adjacent wiring line may be minimized. For example, the first connection layer 120*a* may be formed of a conductive material, such as copper (Cu), chrome (Cr), or the like and the second connection layer 120*b* may be formed of molybdenum (Mo), titanium molybdenum (MoTi), or the like, but are not limited thereto.

A plurality of low potential power lines VSS is disposed on the second passivation layer 116. The plurality of low potential power lines VSS is wiring lines which transmit a low potential power voltage to the light emitting diode LED. The plurality of low potential power lines VSS may extend in the column direction in each of the plurality of sub pixels SP. For example, one pair of low potential power lines VSS which are spaced apart from each other with a predetermined interval may be disposed in each of the first sub pixel SP1, the second sub pixel SP2, and the third sub pixel SP3.

Each of the plurality of low potential power lines VSS includes a conductive layer VSSa and a clad layer VSSb. The conductive layer VSSa is disposed on the second passivation layer 116 and the clad layer VSSb which covers all the top surface and the side surfaces of the conductive layer VSSa is disposed on the conductive layer VSSa. For example, the conductive layer VSSa may be formed of a conductive material, such as copper (Cu), chrome (Cr), and the like. The clad layer VSSb may be formed of a material which is more resistant to corrosion than the conductive layer VSSa, for example, molybdenum (Mo), titanium molybdenum (MoTi), or the like, but is not limited thereto.

A third passivation layer 117 is disposed on the connection electrode 120 and the low potential power line VSS. The third passivation layer 117 is an insulating layer which protects components below the third passivation layer 117 and may comprise a single layer or a double layer of silicon oxide SiOx or silicon nitride SiNx, but is not limited thereto.

Next, a plurality of light emitting diodes LED is disposed on the third passivation layer 117. One or more light emitting diodes LED are disposed in one sub pixel SP. The light emitting diode LED is an element which emits light by the current. The light emitting diode LED may include a light emitting diode LED which emits red light, green light, and blue light and may implement various color light including white by a combination thereof. Further, various color light may be implemented using the light emitting diode LED which emits specific color light and a light conversion member which converts light from the light emitting diode LED into another color light. The light emitting diode LED is electrically connected between the second transistor T2 and the low potential power line VSS to be supplied with a driving current from the second transistor T2 to emit light.

At this time, the plurality of light emitting diodes LED disposed in one sub pixel SP may be connected in parallel. That is, one electrode of each of the plurality of light emitting diodes LED may be connected to the source electrode of the same second transistor T2 and the other electrode may be connected to the same low potential power line VSS.

In the meantime, the light emitting diode LED disposed in each of the plurality of sub pixels SP may have a different structure. For example, the light emitting element LED may include a first light emitting diode 130 and a second light emitting diode 140. The first light emitting diode 130 may be disposed in the first sub pixel SP1, among the plurality of sub pixels SP and the second light emitting diode 140 may be disposed in the second sub pixel SP2 and the third sub pixel SP3, among the plurality of sub pixels SP. However, the type of the light emitting diode LED is illustrative and only any one of the first light emitting diode 130 and the second light emitting diode 140 is used as the light emitting diode LED or another type of light emitting diode LED may be used, but is not limited thereto. Further, even though in FIGS. 3 and 4, for the convenience of description, it is illustrated that two light emitting diodes LED are disposed in each of the plurality of sub pixels SP, the number of light emitting diodes LED which is disposed in each of the plurality of sub pixels SP is not limited thereto.

Referring to FIG. 3, the first light emitting diode 130, among the plurality of light emitting diodes LED, includes a first semiconductor layer 131, an emission layer 132, a second semiconductor layer 133, a first electrode 134, a second electrode 135, and an encapsulation layer 136.

The first semiconductor layer 131 is disposed on the third passivation layer 117 and the second semiconductor layer 133 is disposed on the first semiconductor layer 131. The first semiconductor layer 131 and the second semiconductor layer 133 may be layers formed by doping n-type and p-type impurities into a specific material. For example, the first semiconductor layer 131 and the second semiconductor layer 133 may be layers formed by doping p type or n type impurities into a material, such as gallium nitride (GaN), indium aluminum phosphide (InAlP), and gallium arsenide (GaAs). The p-type impurity may be magnesium (Mg), zinc (Zn), beryllium (Be), and the like, and the n-type impurity may be silicon (Si), germanium (Ge), tin (Sn) and the like, but are not limited thereto.

A part of the first semiconductor layer 131 may be disposed to outwardly protrude from the second semiconductor layer 133. A top surface of the first semiconductor layer 131 may be formed by a part overlapping a bottom surface of the second semiconductor layer 133 and a part disposed at an outside of the bottom surface of the second semiconductor layer 133. However, sizes and shapes of the first semiconductor layer 131 and the second semiconductor layer 133 are modified in various forms, but are not limited thereto.

The emission layer 132 is disposed between the first semiconductor layer 131 and the second semiconductor layer 133. The emission layer 132 is supplied with holes and electrons from the first semiconductor layer 131 and the second semiconductor layer 133 to emit light. The emission layer 132 may be formed by a single layer or a multi-quantum well (MQW) structure, and for example, may be formed of indium gallium nitride (InGaN), gallium nitride (GaN), or the like, but is not limited thereto.

The first electrode 134 which encloses a bottom surface and side surfaces of the first semiconductor layer 131 is disposed. The first electrode 134 is an electrode which electrically connects the first light emitting diode 130 and the low potential power line VSS. The first electrode 134 may comprise conductive material, for example, a transparent conductive material, such as indium tin oxide (ITO) and indium zinc oxide (IZO) or an opaque conductive material, such as titanium (Ti), gold (Au), silver (Ag), and copper (Cu) or an alloy thereof, but is not limited thereto.

The second electrode 135 is disposed on the top surface of the second semiconductor layer 133. The second electrode 135 is an electrode which electrically connects a pixel electrode PE to be described below and the second semiconductor layer 133. The second electrode 135 may be formed of a conductive material, for example, a transparent conductive material, such as indium tin oxide (ITO) or indium zinc oxide (IZO), but is not limited thereto.

The encapsulation layer 136 which encloses at least a part of the first semiconductor layer 131, the emission layer 132, the second semiconductor layer 133, the first electrode 134, and the second electrode 135 is disposed. The encapsulation layer 136 is formed of an insulating material to protect the first semiconductor layer 131, the emission layer 132, and the second semiconductor layer 133. The encapsulation layer 136 may be disposed to cover the emission layer 132, a part of a side surface of the first semiconductor layer 131 adjacent to the emission layer 132, and a part of a side surface of the second semiconductor layer 133 adjacent to the emission layer 132. The first electrode 134 and the second electrode 135 may be exposed from the encapsulation layer 136 and a contact electrode CE and a pixel electrode PE to be formed later and the first electrode 134 and the second electrode 135 may be electrically connected.

Referring to FIG. 4, the second light emitting diode 140 includes a first semiconductor layer 141, an emission layer 142, a second semiconductor layer 143, a first electrode 144, a second electrode 145, and an encapsulation layer 146. The first semiconductor layer 141, the emission layer 142, the second semiconductor layer 143, the second electrode 145, and the encapsulation layer 146 of the second light emitting diode 140 may be substantially the same as the first semiconductor layer 131, the emission layer 132, the second semiconductor layer 133, the second electrode 135, and the encapsulation layer 136 of the first light emitting diode 130.

However, the only difference between the second light emitting diode 140 and the first light emitting diode 130 is a structure of the first electrode 144, but the other configuration is substantially the same.

The first electrode 144 of the second light emitting diode 140 is disposed to be in contact only with a bottom surface of the first semiconductor layer 141. As compared with the first light emitting diode 130 in which the first electrode 134 covers both the bottom surface and the side surface of the first semiconductor layer 131, in the second light emitting diode 140, the first electrode 144 is disposed only on the bottom surface of the first semiconductor layer 141. Therefore, the side surface of the first semiconductor layer 141 of the second light emitting diode 140 may be exposed from the first electrode 144. Therefore, the contact electrode CE is in contact with the side surface of the first semiconductor layer 141 and the side surface of the first electrode 144 to be electrically connected to the second light emitting diode 140.

Next, referring to FIGS. 3 and 4, an adhesive layer 119 is disposed between the plurality of light emitting diodes LED and the third passivation layer 117. The adhesive layer 119 may be an organic film which temporarily fixes the light emitting diode LED during the self-assembly process of the light emitting diode LED. When the display device 100 is manufactured, if an organic film which covers the light emitting diode LED is formed, a part of the organic film is filled in a space between the light emitting diode LED and the third passivation layer 117 to temporary fix the light emitting diode LED onto the third passivation layer 117. Thereafter, even though the organic film is removed, a part of the organic film which permeates under the light emitting diode LED remains without being removed to become an adhesive layer 119. The adhesive layer 119 may be formed of an organic material, for example, photoresist or an acrylic organic material, but is not limited thereto.

The contact electrode CE is disposed on the side surface of the light emitting diode LED. The contact electrode CE is an electrode for electrically connecting the light emitting diode LED and the low potential power line VSS. The contact electrode CE may be electrically connected to the low potential power line VSS through a contact hole formed in the third passivation layer 117. The contact electrode CE is disposed to enclose at least a part of the first semiconductor layers 131 and 141 and the first electrodes 134 and 144 of the light emitting diode LED to electrically connect the first semiconductor layers 131 and 141 and the first electrodes 134 and 144 and the low potential power line VSS.

Next, the second planarization layer 118 is disposed on the light emitting diode LED and the contact electrode CE. The second planarization layer 118 planarizes an upper portion of the substrate 110 in which the light emitting diode LED is disposed and may fix the light emitting diode LED onto the substrate 110 together with the adhesive layer 119. The second planarization layer 118 may comprise a single layer or a double layer, and for example, may be formed of photoresist or an acrylic organic material, but is not limited thereto.

The pixel electrode PE is disposed on the second planarization layer 118. The pixel electrode PE is an electrode which electrically connects the plurality of light emitting diodes LED and the connection electrode 120. The pixel electrode PE may be electrically connected to the light emitting diode LED, the connection electrode 120, and the second transistor T2 through the contact hole formed in the second planarization layer 118. Accordingly, the second electrodes 135 and 145 of the light emitting diodes LED, the connection electrode 120, and the second source electrode SE2 of the second transistor T2 may be electrically connected to each other by means of the pixel electrode PE. The pixel electrode PE may be formed of a conductive material, for example, a transparent conductive material, such as indium tin oxide (ITO) or indium zinc oxide (IZO), but is not limited thereto.

In each of the plurality of sub pixels SP, a lower assembly electrode AE is disposed below one pair of low potential power lines VSS. The lower assembly electrode AE is an electrode for self-assembling the light emitting diode LED. When the display device 100 is manufactured, the lower assembly electrode AE forms an electric field together with one pair of low potential power lines VSS to self-assemble the light emitting diode LED, which will be described in more detail below with reference to FIG. 5A.

The lower assembly electrode AE includes a first lower assembly electrode AE1, a second lower assembly electrode AE2, and an auxiliary lower assembly electrode AE2A.

The first lower assembly electrode AE1 is disposed on the interlayer insulating layer 113. The first lower assembly electrode AE1 may be partially formed in an area of the sub pixel SP which overlaps the light emitting diode LED. A clad layer VSSb of the low potential power line VSS may be disposed to protrude toward an area in which a plurality of light emitting diodes LED is disposed and the first lower assembly electrode AE1 may be disposed to overlap a protruding part of the clad layer VSSb. The first lower assembly electrode AE1 may be electrically connected to one low potential power line VSS of one pair of low potential power lines VSS disposed in the sub pixel SP, through a contact hole formed in the first passivation layer 114, the first planarization layer 115, and the second passivation layer 116.

The second lower assembly electrode AE2 is disposed on the buffer layer 111 and the gate insulating layer 112. The second lower assembly electrode AE2 is disposed below the interlayer insulating layer 113. The second lower assembly electrode AE2 may be partially formed in an area of the sub pixel SP which overlaps the light emitting diode LED. A clad layer VSSb of the low potential power line VSS may be disposed to protrude toward an area in which a plurality of light emitting diodes LED is disposed and the second lower assembly electrode AE2 may be disposed to overlap a protruding part of the clad layer VSSb. The second lower assembly electrode AE2 may be electrically connected to the other low potential power line VSS of one pair of low potential power lines VSS disposed in the sub pixel SP through the auxiliary lower assembly electrode AE2A.

The auxiliary lower assembly electrode AE2A is an electrode which electrically connect the second lower assembly electrode AE2 and the low potential power line VSS and is disposed on the interlayer insulating layer 113. The auxiliary lower assembly electrode AE2A may be electrically connected to the second lower assembly electrode AE2 through a contact hole formed in the interlayer insulating layer 113. The auxiliary lower assembly electrode AE2A may be electrically connected to the low potential power line VSS through a contact hole formed in the first passivation layer 114, the first planarization layer 115, and the second passivation layer 116.

In the meantime, in a plan view, an interval of one pair of low potential power lines VSS has a first length D1 and an interval between the first lower assembly electrode AE1 and the second lower assembly electrode AE2 may have a second length D2 which is shorter than the first length D1.

A minimum width of an area between one pair of low potential power lines VSS has a first length D1 and a minimum width of an area between the first lower assembly electrode AE1 and the second lower assembly electrode AE2 may have a second length D2 which is shorter than the first length D1.

One pair of low potential power lines VSS is disposed on the same plane, that is, on a top surface of the second passivation layer 116 to be formed by the same process. Therefore, when one pair of low potential power lines VSS is formed by patterning a metal layer, it is difficult to reduce an interval between one pair of low potential power lines VSS to be lower than a predetermined level due to a specification limitation of process equipment, such as an error range or a resolution of the process equipment. When the interval between one pair of low potential power lines VSS is reduced by ignoring such an error range, there may be a problem in that one pair of low potential power lines VSS is connected. Further, it is difficult to form an electric field to self-assemble the light emitting diode LED by applying different voltages to one pair of low potential power lines VSS.

In contrast, the first lower assembly electrode AE1 and the second lower assembly electrode AE2 are disposed on different planes to be formed by different processes. Accordingly, the interval between the first lower assembly electrode AE1 and the second lower assembly electrode AE2 may be formed to be smaller than the interval between one pair of low potential power lines VSS without being limited to the specification of the process equipment. The first lower assembly electrode AE1 and the second lower assembly electrode AE2 are insulated from each other with the interlayer insulating layer 113 therebetween. Therefore, even though the first lower assembly electrode AE1 and the second lower assembly electrode AE2 partially overlap, the first lower assembly electrode AE1 and the second lower assembly electrode AE2 may normally form an electric field during the self-assembling of the light emitting diode LED.

Accordingly, in the display device 100 according to the exemplary aspect of the present disclosure, lower assembly electrodes AE with a narrower interval are additionally formed to the low potential power line VSS used as an assembly electrode to improve an assembly rate of the plurality of light emitting diodes LED. As the lower assembly electrodes AE are formed with a narrower interval so that an electric field with a stronger intensity may be formed and the self-assembly rate of the plurality of light emitting diodes LED may be improved.

Hereinafter, a self-assembling method of a light emitting diode LED of a display device 100 according to an exemplary aspect of the present disclosure and an assembly rate improving effect will be described with reference to FIGS. 5A to 6B.

Figure 5A:
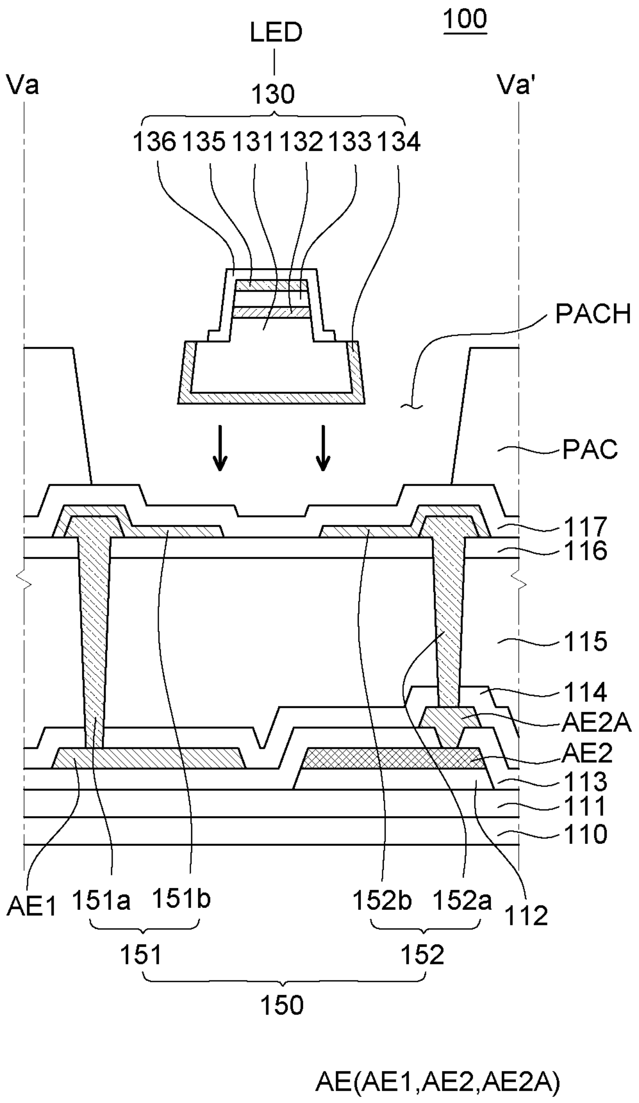
FIG. 5A is a cross-sectional view for explaining a manufacturing process of a display device according to an exemplary aspect of the present disclosure.
Figure 5B:
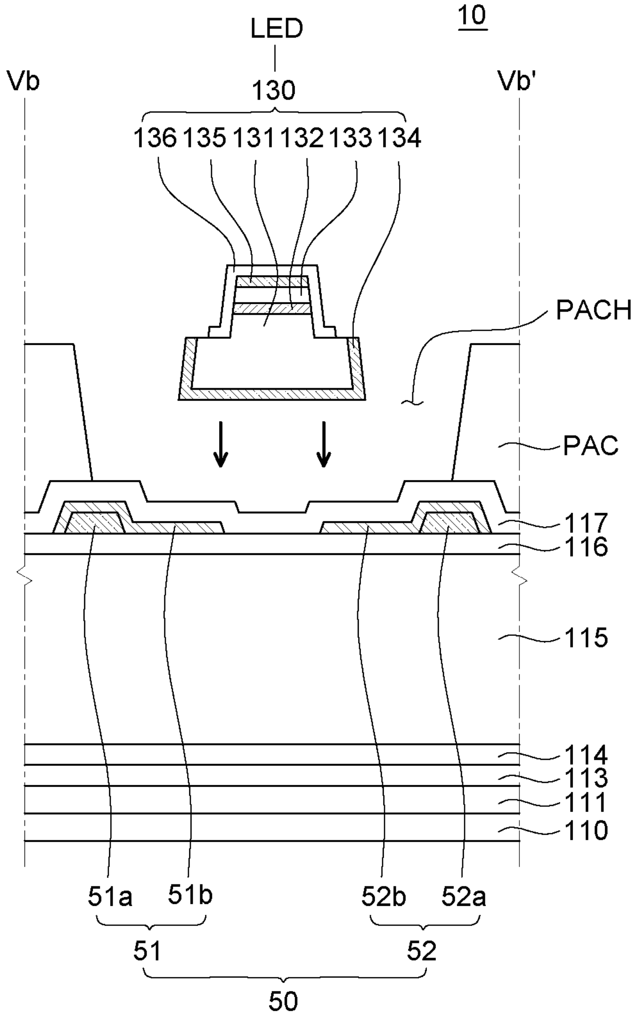
FIG. 5B is a cross-sectional view for explaining a manufacturing process of a display device according to Comparative Aspect 1.
Figure 6A:
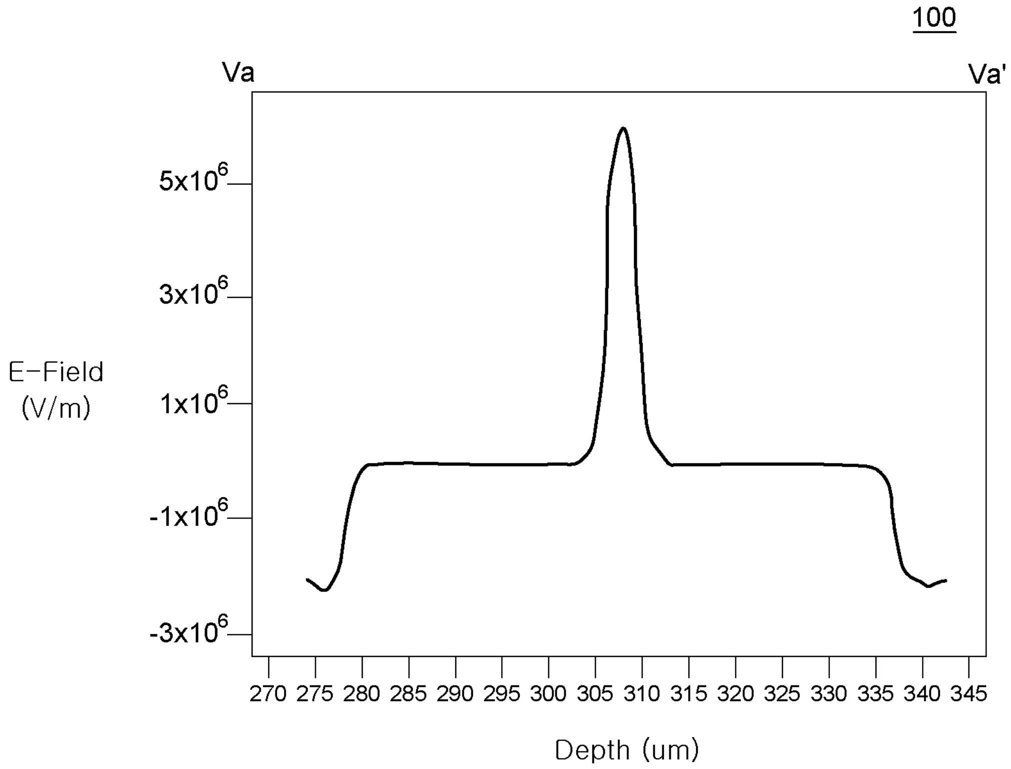
FIG. 6A is a graph obtained by measuring an intensity of an electric field formed by one pair of assembly electrodes of a display device according to an exemplary aspect of the present disclosure.
Figure 6B:
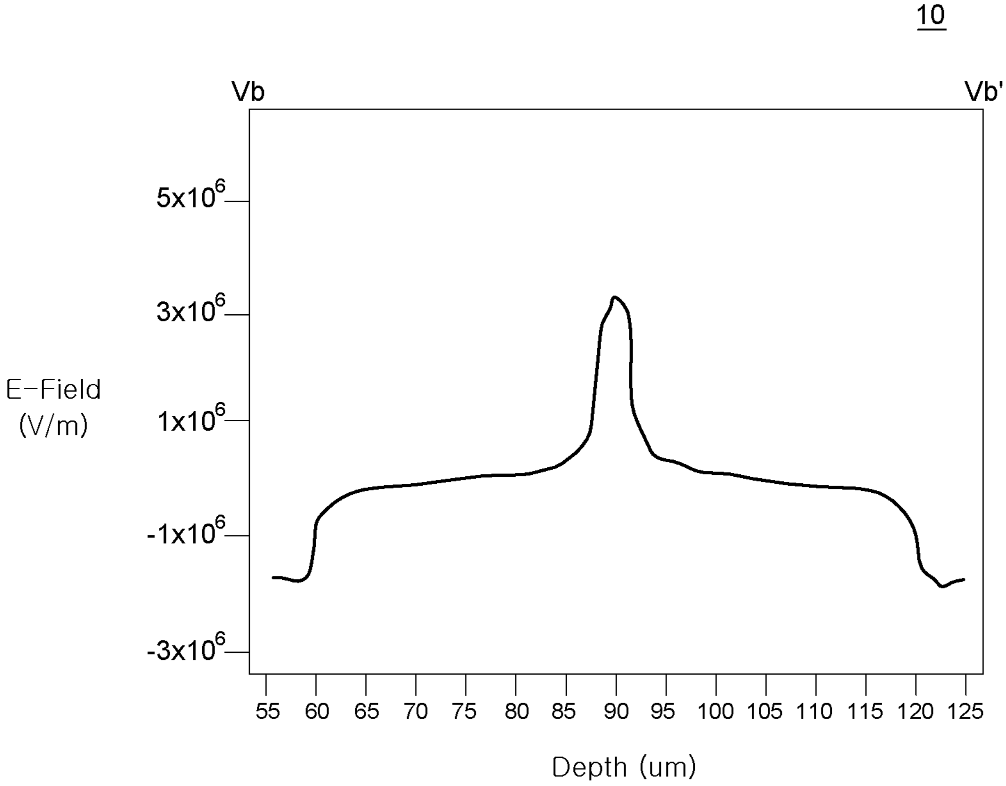
FIG. 6B is a graph obtained by measuring an intensity of an electric field formed by one pair of assembly electrodes of a display device according to Comparative Aspect 1.

FIG. 5A is a cross-sectional view for explaining a manufacturing process of a display device according to an exemplary aspect of the present disclosure. FIG. 5B is a cross-sectional view for explaining a manufacturing process of a display device according to Comparative Aspect 1. FIG. 6A is a graph obtained by measuring an intensity of an electric field formed by one pair of assembly electrodes of a display device according to an exemplary aspect of the present disclosure. FIG. 6B is a graph obtained by measuring an intensity of an electric field formed by one pair of assembly electrodes of a display device according to Comparative Aspect 1.

First, referring to FIG. 5A, the buffer layer 111 and the gate insulating layer 112 are formed on the substrate 110 and the second lower assembly electrode AE2, among the lower assembly electrodes AE, is formed on the gate insulating layer 112.

Next, the interlayer insulating layer 113 is formed on the second lower assembly electrode AE2. The first lower assembly electrode AE1 and the auxiliary lower assembly electrode AE2A, among the lower assembly electrodes AE, are formed on the interlayer insulating layer 113.

Next, the first passivation layer 114, the first planarization layer 115, and the second passivation layer 116 are sequentially formed on the lower assembly electrode AE and the upper assembly electrode 150 is formed on the second passivation layer 116.

After completing the manufacturing of the display device 100, the upper assembly electrode 150 may serve as one pair of low potential power lines VSS. During the manufacturing process of the display device 100, different voltages are applied to two adjacent upper assembly electrodes 150 and after completing the manufacturing process of the display device 100, a same low potential power voltage may be applied to two adjacent upper assembly electrodes 150. The upper assembly electrode 150 has the same configuration as the low potential power line VSS and for the convenience of description, in FIG. 5A, it is referred to as an upper assembly electrode 150.

The upper assembly electrode 150 includes a first upper assembly electrode 151 and a second upper assembly electrode 152.

The first upper assembly electrode 151 is disposed on the second passivation layer 116. The first upper assembly electrode 151 includes a first conductive layer 151*a* and a first clad layer 151*b* which covers the first conductive layer 151*a*. The first conductive layer 151*a* of the first upper assembly electrode 151 may be electrically connected to the first lower assembly electrode AE1 through a contact hole formed in the second passivation layer 116, the first planarization layer 115, and the first passivation layer 114.

The second upper assembly electrode 152 is disposed on the second passivation layer 116. The second upper assembly electrode 152 includes a second conductive layer 152*a* and a second clad layer 152*b* which covers the second conductive layer 152*a*. The second conductive layer 152*a* of the second upper assembly electrode 152 may be electrically connected to an auxiliary lower assembly electrode AE2A and the second lower assembly electrode AE2 through a contact hole formed in the second passivation layer 116, the first planarization layer 115, and the first passivation layer 114. By doing this, the formation of the assembly electrode including the upper assembly electrode 150 and the lower assembly electrode AE may be finished.

Next, the third passivation layer 117 is formed on the upper assembly electrode 150. An organic layer PAC having an opening PACH is formed on the third passivation layer 117. The opening PACH of the organic layer PAC may correspond to an area in which the light emitting diode LED is self-assembled. The opening PACH of the organic layer PAC may overlap the upper assembly electrode 150 and the lower assembly electrode AE. After completing the self-assembling of the light emitting diode LED, the organic layer PAC is removed so as not to be present in the display device 100 for which the manufacturing process is finished.

The substrate 110 on which the organic layer PAC is formed and the light emitting diode LED are put into a chamber filled with fluids and an AC voltage is applied to the assembly electrode including the upper assembly electrode 150 and the lower assembly electrode AE to form an electric field. For example, the same voltage is applied to the first upper assembly electrode 151 and the first lower assembly electrode AE1 and the same voltage is applied to the second upper assembly electrode 152 and the second lower assembly electrode AE2. By doing this, an electric field may be formed between the first upper assembly electrode 151 and the second upper assembly electrode 152, that is, between the first lower assembly electrode AE1 and the second lower assembly electrode AE2.

The light emitting diode LED is dielectrically polarized by the electric field to have a polarity. The dielectrically polarized light emitting diode LED may move or may be fixed to a specific direction by dielectrophoresis (DEP), that is, an electric field. Accordingly, the plurality of light emitting diodes LED may be self-assembled in the opening PACH above the upper assembly electrode 150 and the lower assembly electrode AE using the dielectrophoresis.

Finally, when the self-assembling of the light emitting diode LED is completed, the organic layer PAC is removed and another configuration, such as the adhesive layer 119, the second planarization layer 118 and the pixel electrode PE, is formed to complete the manufacturing process of the display device 100.

In the meantime, the dielectrophoresis force is proportional to a size of the light emitting diode LED and an intensity of the electric field. The larger the size of the light emitting diode LED or the higher the intensity of the electric field, the stronger the dielectrophoresis acts to improve the assembly rate.

Accordingly, in the display device 100 according to the exemplary aspect of the present disclosure, to increase the dielectrophoresis, the intensity of the electric field may be increased. For example, the narrower the interval between the assembly electrodes, the higher the intensity of the electric field. The narrower the interval between the first upper assembly electrode 151 and the first lower assembly electrode AE1 and the second upper assembly electrode 152 and the second lower assembly electrode AE2, the higher the intensity of the electric field. Accordingly, in the display device 100 according to the exemplary aspect of the present disclosure, the intensity of the electric field is increased by reducing the interval between the assembly electrodes to improve the self-assembly rate.

Specifically, as described above, the first upper assembly electrode 151 and the second upper assembly electrode 152 are formed on the same plane so that it is difficult to form the interval between the first upper assembly electrode 151 and the second upper assembly electrode 152 to be a predetermined level or lower. However, the first lower assembly electrode AE1 and the second lower assembly electrode AE2 are insulated with the interlayer insulating layer 113 therebetween so that the interval between the first lower assembly electrode AE1 and the second lower assembly electrode AE2 may be formed to be narrower by overcoming the process limitation. Therefore, the intensity of the electric field may be increased by the first lower assembly electrode AE1 and the second lower assembly electrode AE2 with a narrower interval and the self-assembly rate of the light emitting diode LED may be improved.

Actually, referring to FIG. 6A, the intensity of the electric field on the cross-sectional view of FIG. 5A may be confirmed. Specifically, FIG. 6A is a graph obtained by measuring an electric field from a position of a cut line Va of FIG. 5A to a position of a cut line Va'. In the graph, the X-axis represents a measurement position of the electric energy and the Y-axis represents the electric energy. A center portion corresponding to approximately 305 um to 310 um of the X-axis of the graph corresponds to the opening PACH of the organic layer PAC. Further, each of a left portion and a right portion of the center portion of the X-axis corresponds to an area in which the organic layer PAC covering the upper assembly electrode 150 and the lower assembly electrode AE is formed.

Referring to FIG. 6A, in the display device 100 according to the exemplary aspect of the present disclosure including the upper assembly electrode 150 and the lower assembly electrode AE, an electric field having strongest intensity, for example, approximately 5 $10^6$ V/m is formed in a region of 305 um to 310 um corresponding to the opening PACH. Therefore, the light emitting diode LED may be easily self-assembled in the opening PACH in response to the electric field with a strong intensity.

In the meantime, as in the display device 100 according to the exemplary aspect of the present disclosure, when only the upper assembly electrode 150 is formed without forming the lower assembly electrode AE, the intensity of the electric field is weakened to degrade the assembly rate.

For example, referring to FIG. 5B, a display device 10 according to Comparative Aspect 1 includes an upper assembly electrode 50 formed on the second passivation layer 116. The upper assembly electrode 50 includes a first upper assembly electrode 51 and a second upper assembly electrode 52. The first upper assembly electrode 51 includes a first conductive layer 51*a* and a first clad layer 51*b* and the second upper assembly electrode 52 includes a second conductive layer 52*a* and a second clad layer 52*b*.

In the meantime, in the display device 10 according to Comparative Aspect 1 in which only the upper assembly electrode 50 is formed, it is difficult to form an interval between the upper assembly electrodes 50 formed on the same plane to be a predetermined level or lower due to the limitation of the process. Therefore, in the display device 10 according to Comparative Aspect 1, the minimum interval between the upper assembly electrodes 50 may be larger than the minimum interval of the lower assembly electrodes AE in the display device 100 according to the exemplary aspect of the present disclosure. Accordingly, in the display device 10 according to Comparative Aspect 1, the maximum intensity of the electric field formed from the upper assembly electrode 50 may be lower than the maximum intensity of the electric field formed from the assembly electrode of the display device 100 according to the exemplary aspect of the present disclosure.

Specifically, referring to FIG. 6B, an intensity of the electric field on the cross-sectional view of FIG. 5B may be confirmed. FIG. 6B is a graph obtained by measuring an electric field from a position of a cut line Vb of FIG. 5B to a position of a cut line Vb' in which the X-axis represents a measurement position of an electric energy and the Y-axis represents the electric energy. A center portion corresponding to approximately 85 um to 95 um of the X-axis of the graph corresponds to the opening PACH of the organic layer PAC. Further, each of a left portion and a right portion of the center portion of the X-axis corresponds to an area in which the organic layer PAC covering the upper assembly electrode 50 is formed.

Referring to FIG. 6B, it is confirmed that also in the display device 10 according to Comparative Aspect 1 including only the upper assembly electrode 50, the electric field having strongest intensity is formed in an area corresponding to the opening PACH. However, it is confirmed that the maximum intensity of the electric field formed in the opening PACH in the display device 10 according to Comparative Aspect 1 in which only the upper assembly electrode 50 is formed is approximately 3 $10^6$ V/m, which is lower than approximately 5 $10^6$ V/m which is the maximum intensity of the electric field of the display device 100 according to the exemplary aspect of the present disclosure illustrated in FIG. 6A.

Accordingly, in the display device 100 according to the exemplary aspect of the present disclosure, the lower assembly electrode AE is additionally formed to increase the intensity of the electric field for self-assembling the light emitting diode LED while reducing a minimum interval of the assembly electrode.

In the meantime, when only the lower assembly electrode AE is formed, instead of the upper assembly electrode 150, it may be difficult to self-assemble the light emitting diode LED due to the asymmetric structure of the lower assembly electrode AE. Specifically, the lower assembly electrode AE may have an asymmetric structure in which the first lower assembly electrode AE1 and the second lower assembly electrode AE2 are disposed on different planes. In this case, the electric field is not uniformly formed due to the asymmetric structure of the lower assembly electrode AE and it may be difficult to self-assemble the light emitting diode LED in the opening PACH.

However, in the display device 100 according to the exemplary aspect of the present disclosure, the symmetric upper assembly electrode 150 is also disposed so that the imbalanced electric field due to the asymmetric lower assembly electrode AE may be compensated. As the upper assembly electrode 150 has a symmetric structure, a uniform electric field may be formed in the opening PACH and the light emitting diode LED may be easily assembled.

Accordingly, in the display device 100 according to the exemplary aspect of the present disclosure, the lower assembly electrode AE with a narrow interval is formed to increase the intensity of the electric field and the symmetric upper assembly electrode 150 is formed to compensate for the balance of the electric field. Therefore, the plurality of light emitting diodes LED may be easily self-assembled in a correct position using a balanced electric field with an increased intensity.

Figure 7:
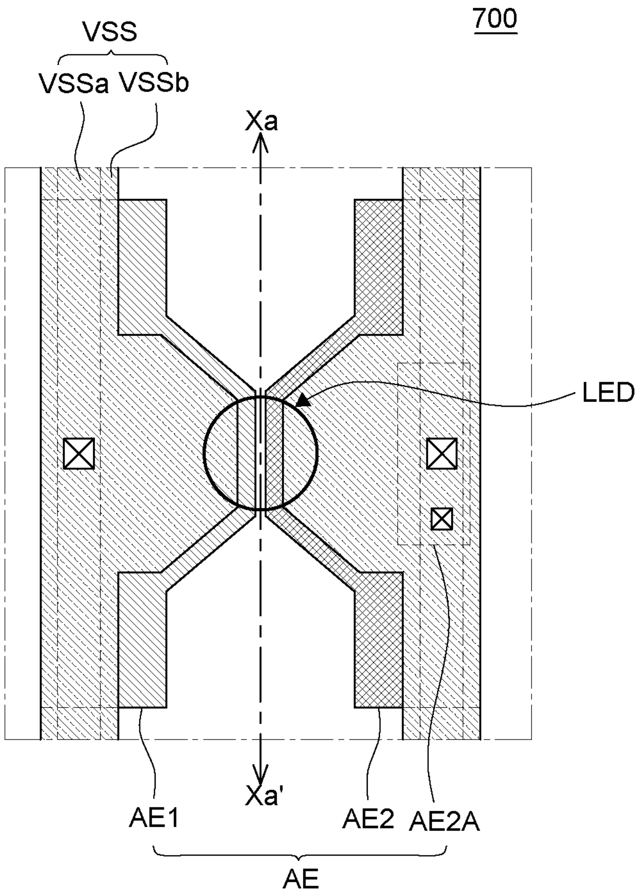
FIG. 7 is an enlarged plan view of a display device according to another exemplary aspect of the present disclosure.
Figure 8:
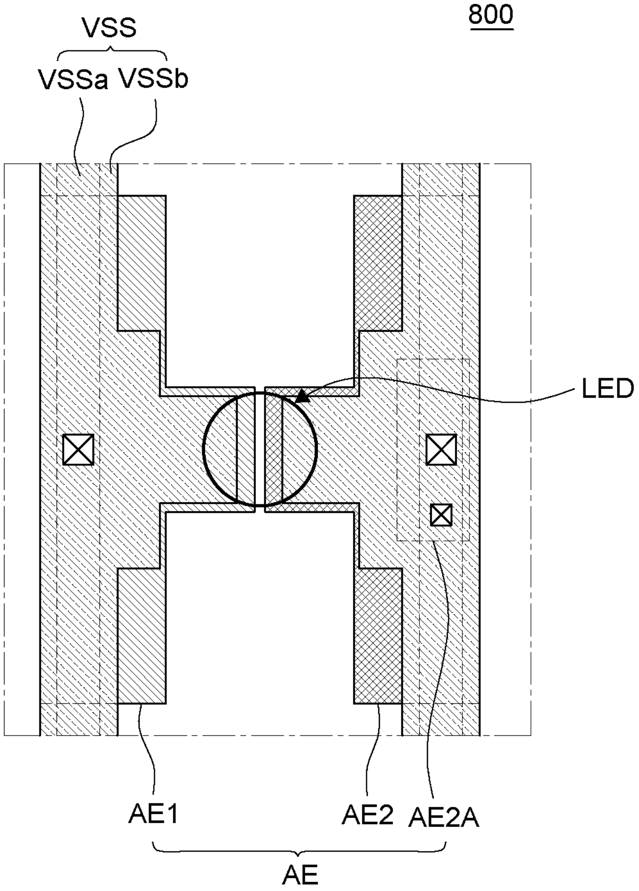
FIG. 8 is an enlarged plan view of a display device according to still another exemplary aspect of the present disclosure.
Figure 9:
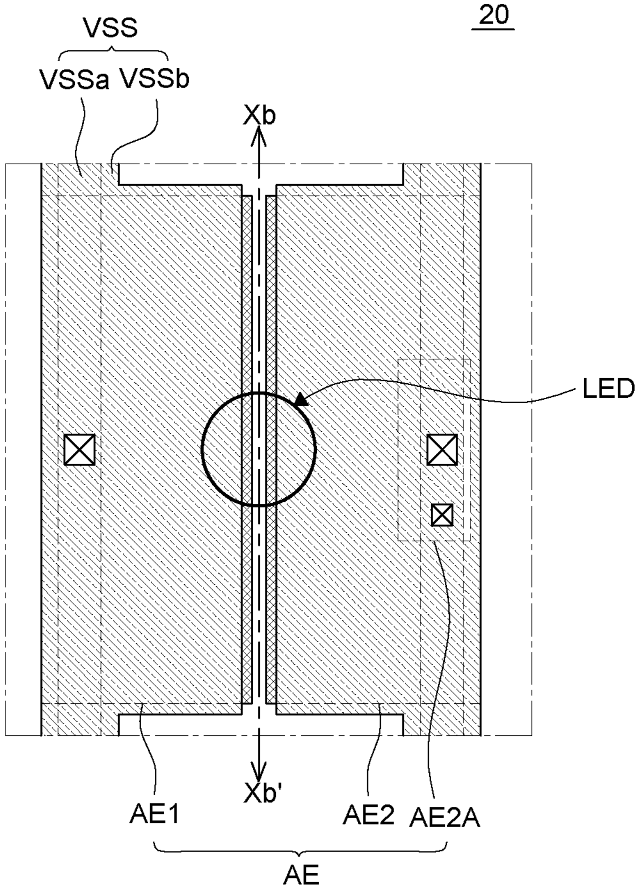
FIG. 9 is an enlarged plan view of a display device according to Comparative Aspect 2.
Figure 10A:
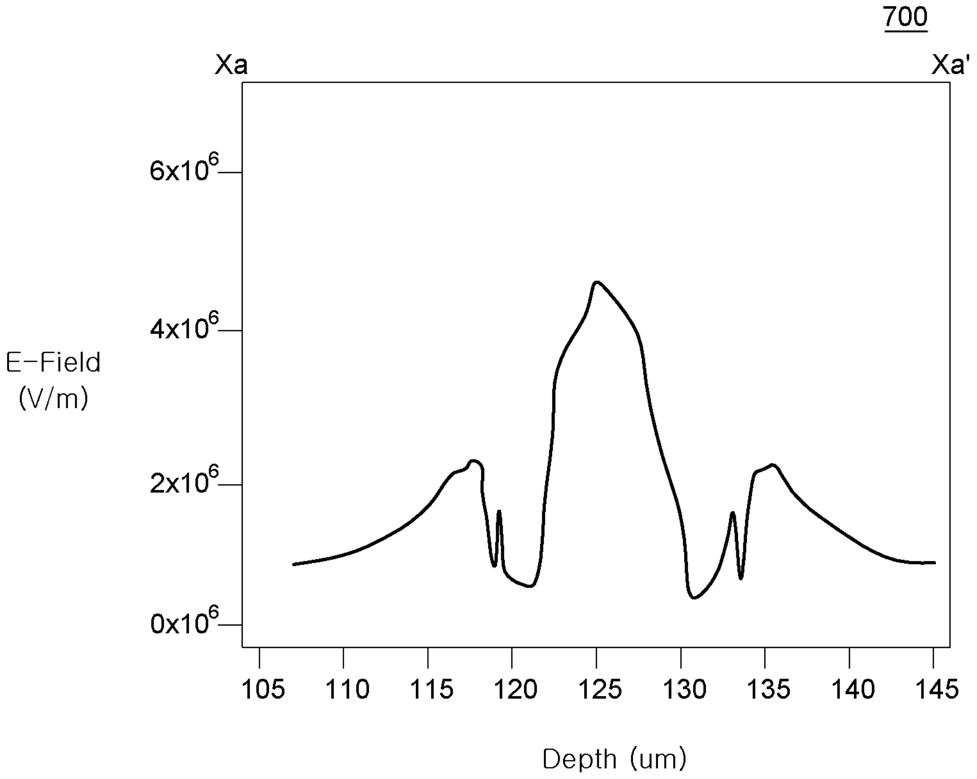
FIG. 10A is a graph obtained by measuring an intensity of an electric field along marked line of Xa-Xa' of FIG. 7.
Figure 10B:
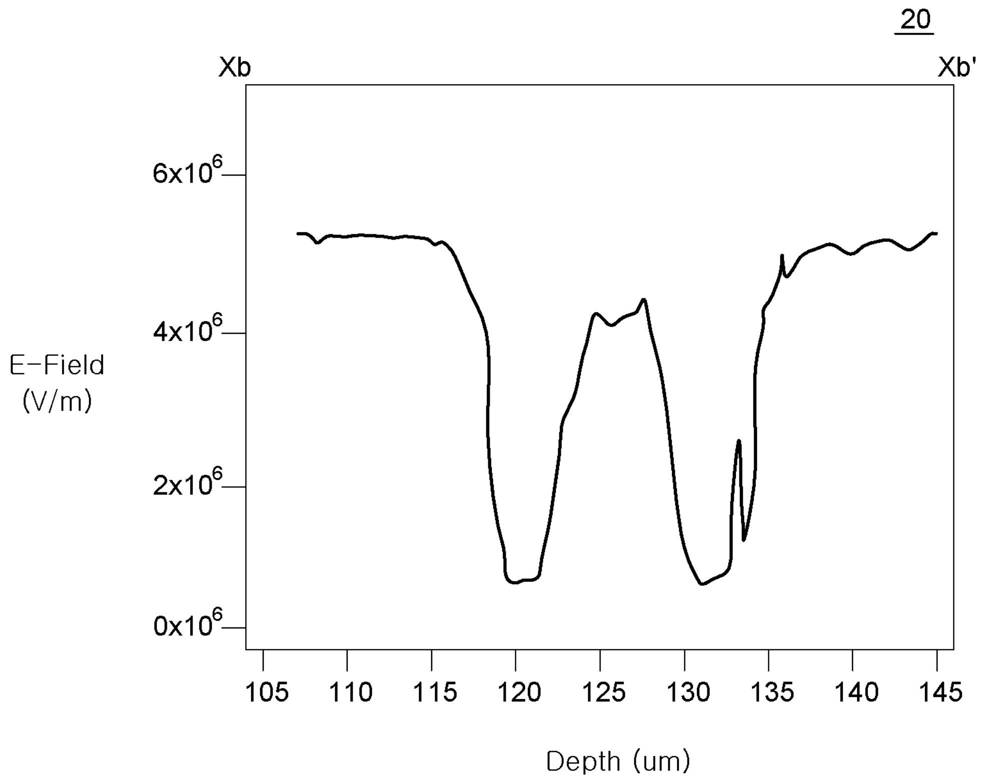
FIG. 10B is a graph obtained by measuring an intensity of an electric field along marked line of Xb-Xb' of FIG. 9.

FIG. 7 is an enlarged plan view of a display device according to another exemplary aspect of the present disclosure. FIG. 8 is an enlarged plan view of a display device according to still another exemplary aspect of the present disclosure. FIG. 9 is an enlarged plan view of a display device according to Comparative Aspect 2. FIG. 10A is a graph obtained by measuring an intensity of an electric field along marked line of Xa-Xa' of FIG. 7 and FIG. 10B is a graph obtained by measuring an intensity of an electric field along marked line of Xb-Xb' of FIG. 9. In FIGS. 7 to 9, for the convenience of description, only one pair of low potential power lines VSS, the lower assembly electrode AE, and the light emitting diode LED are illustrated and only one of the plurality of light emitting diodes LED is illustrated.

Referring to FIG. 7, in the display device 700 according to another exemplary aspect of the present disclosure, a lower assembly electrode AE is additionally formed to increase the intensity of the electric field and the plurality of assembly electrodes is patterned. By doing this, the electric field may be concentrated in the correct position where the light emitting diode LED is self-assembled.

First, a clad layer VSSb of a low potential power line VSS which serves as the upper assembly electrode 150 includes a portion protruding toward an area in which the light emitting diode LED is assembled. The protruding portions of the clad layers VSSb of one pair of low potential power lines VSS may be formed with a constant interval in an area overlapping the light emitting diode LED. The protruding portion of the clad layer VSSb may be formed to have a narrowest interval in the area overlapping the light emitting diode LED. In an area which does not overlap the light emitting diode LED, the protruding portion of the clad layer VSSb is gradually increased so that the intensity of the electric field may be weakened in an area which does not overlap the light emitting diode LED. In the area which does not overlap the light emitting diode LED, the clad layer VSSb is formed to have an inclined structure so that an interval between the clad layers VSSb may increase as the distance from the light emitting element LED increases.

Further, the lower assembly electrode AE also may have the same structure as the clad layer VSSb. The first lower assembly electrode AE1 and the second lower assembly electrode AE2 may have a shape that the interval therebetween is the smallest in the area overlapping the light emitting diode LED and the interval is gradually increased as the distance from the light emitting diode LED is increased.

Next, referring to FIG. 8, in the display device 800 according to still another exemplary aspect of the present disclosure, a lower assembly electrode AE is additionally formed to increase the intensity of the electric field. Further, the plurality of assembly electrodes is patterned so that the electric field may be concentrated in the correct position where the light emitting diode LED is self-assembled.

A clad layer VSSb of a low potential power line VSS which serves as the upper assembly electrode 150 includes a portion protruding toward an area in which the light emitting diode LED is assembled. The protruding portions of the clad layers VSSb of one pair of low potential power lines VS S may be formed with a narrowest interval in an area overlapping the light emitting diode LED. The interval between the clad layers VS Sb is increased in an area which does not overlap the light emitting diode LED so that the intensity of the electric field may be weakened in the area which does not overlap the light emitting diode LED. For example, the interval between the clad layer VSSb in the area overlapping the light emitting diode LED may be narrower than the interval between the clad layer VSSb in the area which does not overlap the light emitting diode LED.

The first lower assembly electrode AE1 and the second lower assembly electrode AE2 of the lower assembly electrode AE are also disposed with a narrowest interval in an area which overlaps the light emitting diode LED and are disposed with a broad interval in the area which does not overlap the light emitting diode LED.

Referring to FIG. 10A, like the display devices 700 and 800 according to various exemplary aspects of the present disclosure, when the interval of the assembly electrodes is formed to be narrow only in the correct position in which the light emitting diode LED is assembled, it is confirmed that the intensity of the electric field is strongest in the correct position. FIG. 10A is a graph obtained by measuring an electric field along marked line of Xa-Xa' of FIG. 7. In the graph, the X-axis represents a measurement position of the electric energy and the Y-axis represents the electric energy. A center portion corresponding to approximately 120 um to 130 um, in the X-axis of the graph, is an area corresponding to the opening PACH of the organic layer PAC, that is, a correct position in which the light emitting diode LED is assembled. Further, a left portion and a right portion of the center portion of the X-axis of the graph correspond to an area in which the organic layer PAC covering the assembly electrode is formed.

Therefore, referring to FIG. 10A, it is confirmed that the electric field formed in the position of approximately 120 um to 130 um, which is an area corresponding to the correct position in which the light emitting diode LED is assembled has the strongest intensity of approximately 4 $10^6$ V/m or more. Further, among the electric fields formed in an area other than the correct position in which the light emitting diode LED is assembled, the strongest electric field is approximately 2 $10^6$ V/m, which is approximately twice as small as the electric field in the correct position. Therefore, as in the display devices 700 and 800 according to various exemplary aspects of the present disclosure, when the assembly electrode is formed with a narrow interval only in the correct position, the strong electric field is formed only in the correct position. Accordingly, the light emitting diode LED may be easily self-assembled in the correct position.

In the meantime, when the assembly electrodes are formed with the narrow interval even in a place that is not in the correct positions, the electric field formed at the outside of the correct position may interrupt the self-assembling of the light emitting diode LED in the correct position.

For example, referring to FIG. 9, in the display device 20 according to Comparative Aspect 2, the interval of the assembly electrodes in the correct position in which the light emitting diode LED is assembled is equal to the interval of the assembly electrodes in an area in which the light emitting diode LED is not assembled. In both the correct position and the place, which is not the correct position, the interval between the first lower assembly electrode AE1 and the second lower assembly electrode AE2 is constant and the interval between the clad layers VSSb of one pair of low potential power lines VSS may be constant.

FIG. 10B is a graph obtained by measuring an electric field along marked line of Xb-Xb' of FIG. 9. In the graph, the X-axis represents a measurement position of the electric energy and the Y-axis represents the electric energy. A center portion corresponding to approximately 120 um to 130 um, in the X-axis of the graph, is an area corresponding to the correct position in which the light emitting diode LED is assembled. Further, a left portion and a right portion of the center portion of the X-axis of the graph correspond to an area in which the organic layer PAC covering the assembly electrode is formed.

In this case, referring to FIG. 10B together, the electric field formed in the position of approximately 120 um to 130 um which is an area corresponding to the correct position in which the light emitting diode LED is assembled is approximately 4 $10^6$ V/m. Further, it is confirmed that the strongest electric field, among the electric fields formed in the remaining areas other than the correct position, is approximately 5 $10^6$ V/m. That is, it is confirmed that the intensity of the electric field in the center portion of the graph corresponding to the correct position in which the light emitting diode LED is assembled is lower than the intensity of the electric field on both portions of the graph corresponding to the position in which the light emitting diode LED is not assembled. Accordingly, when the assembly electrode is formed as in the display device 20 according to Comparative Aspect 2, the electric field generated in the place which is not the correct position may interrupt the light emitting diode LED from being assembled in the correct position and the yield may be degraded.

In the meantime, even though in FIGS. 7 and 8, it is illustrated that a width of the protruding portion of the assembly electrode with the smallest interval has the same size as the light emitting diode LED, a width of the protruding portion of the assembly electrode may be formed to be smaller than the light emitting diode LED or larger than the light emitting diode LED. However, it is limited thereto.

Accordingly, in the display devices 700 and 800 according to various exemplary aspects of the present disclosure, in the correct position in which the light emitting diode LED is assembled, the interval of one pair of assembly electrodes is formed to be smallest to form the strongest intensity of the electric field. Further, as the distance from the correct position is increased, the interval between the assembly electrodes is formed to be larger so that the intensity of the electric field in a place which is not the correct position may be weakened. Therefore, a part of the assembly electrode which does not overlap the correct position is removed to intensively form the electric field in the correct position and the self-assembly rate of the light emitting diode LED may be improved. Accordingly, in the display devices 700 and 800 according to various exemplary aspects of the present disclosure, the lower assembly electrode AE is additionally formed to intensively form the electric field only in the correct position in which the light emitting diode LED is assembled while increasing the intensity of the electric field. By doing this, the light emitting diode LED may be easily self-assembled and the reliability of the display devices 700 and 800 may be improved.

The exemplary aspects of the present disclosure may also be described as follows:

According to an aspect of the present disclosure, there is provided a display device. The display device includes a substrate in which a plurality of sub pixels is defined, a first lower assembly electrode disposed in each of the plurality of sub pixels, an interlayer insulating layer disposed below the first lower assembly electrode, a second lower assembly electrode disposed below the interlayer insulating layer and disposed in each of the plurality of sub pixels, a passivation layer disposed on the first lower assembly electrode and the second lower assembly electrode, and a first upper assembly electrode and a second upper assembly electrode which are disposed on the passivation layer and are disposed to be spaced apart from each other. A minimum interval of the first lower assembly electrode and the second lower assembly electrode is smaller than a minimum interval of the first upper assembly electrode and the second upper assembly electrode on a plane.

The first lower assembly electrode may be electrically connected to the first upper assembly electrode and the second lower assembly electrode may be electrically connected to the second upper assembly electrode.

The display device may further include an auxiliary lower assembly electrode which is disposed on the interlayer insulating layer to overlap the second lower assembly electrode, the second lower assembly electrode may be electrically connected to the second upper assembly electrode through the auxiliary lower assembly electrode.

The display device may further include a plurality of light emitting diodes disposed on the first upper assembly electrode and the second upper assembly electrode, the plurality of light emitting diodes may be electrically connected to the first upper assembly electrode and the second upper assembly electrode.

The plurality of light emitting diodes may overlap an area between the first upper assembly electrode and the second upper assembly electrode and an area between the first lower assembly electrode and the second lower assembly electrode.

The first upper assembly electrode may include a first conductive layer disposed on the passivation layer and a first clad layer which covers the first conductive layer, the second upper assembly electrode may include a second conductive layer disposed on the passivation layer and a second clad layer which covers the second conductive layer, and the first upper assembly electrode and the second upper assembly electrode may be symmetrically disposed.

At least a part of the second clad layer may protrude toward the plurality of light emitting diodes to overlap the first lower assembly electrode.

An interval between the first clad layer and the second clad layer may be constant in an area overlapping the plurality of light emitting diodes and the interval between the first clad layer and the second clad layer gradually may increase as a distance from the plurality of light emitting diodes increases.

An interval between the first clad layer and the second clad layer in an area overlapping the plurality of light emitting diodes may be smaller than an interval between the first clad layer and the second clad layer in an area which does not overlap the plurality of light emitting diodes.

An interval between the first clad layer and the second clad layer is constant in the area overlapping the plurality of light emitting diodes and the interval between the first clad layer and the second clad layer is constant in the area which does not overlap the plurality of light emitting diodes.

According to another aspect of the present disclosure, there is provided a display device. The display device includes a lower assembly electrode which is disposed on a substrate and includes a first lower assembly electrode and a second lower assembly electrode spaced apart from each other, and an upper assembly electrode which is disposed on the lower assembly electrode and includes a first upper assembly electrode and a second upper assembly electrode spaced apart from each other, the first lower assembly electrode and the second lower assembly electrode are disposed on different planes to form an asymmetric structure and the first upper assembly electrode and the second upper assembly electrode are disposed on the same plane to form a symmetric structure.

The display device may further comprise one or more light emitting diodes disposed on the upper assembly electrode. The light emitting diode may overlap an area between the first lower assembly electrode and the second lower assembly electrode and an area between the first upper assembly electrode and the second upper assembly electrode and a minimum width of an area between the first lower assembly electrode and the second lower assembly electrode may be smaller than a minimum width of an area between the first upper assembly electrode and the second upper assembly electrode.

The display device may further include an interlayer insulating layer which is disposed below the first lower assembly electrode and covers the second lower assembly electrode, a first passivation layer disposed between the first lower assembly electrode and the upper assembly electrode, a planarization layer disposed between the first passivation layer and the upper assembly electrode, and a second passivation layer disposed between the planarization layer and the upper assembly electrode. The upper assembly electrode may be disposed on a top surface of the second passivation layer and the first lower assembly electrode and the second lower assembly electrode may be separated with the interlayer insulating layer therebetween.

The display device may further include an auxiliary lower assembly electrode which is disposed between the interlayer insulating layer and the first passivation layer and is electrically connected to the second lower assembly electrode. The first upper assembly electrode may be electrically connected to the first lower assembly electrode through a contact hole of the second passivation layer, the planarization layer, and the first passivation layer, and the second upper assembly electrode may be electrically connected to the auxiliary lower assembly electrode through the contact hole of the second passivation layer, the planarization layer, and the first passivation layer.

An interval between the first upper assembly electrode and the second upper assembly electrode and an interval between the first lower assembly electrode and the second lower assembly electrode may increase as a distance from the light emitting diode increases.

The display device may further comprise one or more light emitting diodes disposed on the upper assembly electrode. An interval between the first upper assembly electrode and the second upper assembly electrode and an interval between the first lower assembly electrode and the second lower assembly electrode may have a minimum value in an area overlapping the light emitting diode.

An interval between the first upper assembly electrode and the second upper assembly electrode and an interval between the first lower assembly electrode and the second lower assembly electrode are constant as a distance from the light emitting diode increases.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure.

It will be apparent to those skilled in the art that various modifications and variations can be made in the display device of the present disclosure without departing from the spirit or scope of the aspects of the present disclosure. Thus, it is intended that the present disclosure covers the modifications and variations of the aspects provided they come within the scope of the appended claims and their equivalents.

What is claimed is:

1. A display device, comprising:

a substrate in which a plurality of sub pixels is defined;

a first lower assembly electrode disposed in each of the plurality of sub pixels;

an interlayer insulating layer disposed below the first lower assembly electrode;

a second lower assembly electrode disposed below the interlayer insulating layer and disposed in each of the plurality of sub pixels;

a passivation layer disposed on the first lower assembly electrode and the second lower assembly electrode; and a first upper assembly electrode and a second upper assembly electrode which are disposed on the passivation layer and are spaced apart from each other, wherein a minimum interval of the first lower assembly electrode and the second lower assembly electrode is smaller than a minimum interval of the first upper assembly electrode and the second upper assembly electrode on a plane.

2. The display device according to claim 1, wherein the first lower assembly electrode is electrically connected to the first upper assembly electrode and the second lower assembly electrode is electrically connected to the second upper assembly electrode.

3. The display device according to claim 2, further comprising an auxiliary lower assembly electrode which is disposed on the interlayer insulating layer to overlap the second lower assembly electrode, wherein the second lower assembly electrode is electrically connected to the second upper assembly electrode through the auxiliary lower assembly electrode.

4. The display device according to claim 1, further comprising a plurality of light emitting diodes disposed on the first upper assembly electrode and the second upper assembly electrode, wherein the plurality of light emitting diodes is electrically connected to the first upper assembly electrode and the second upper assembly electrode.

5. The display device according to claim 4, wherein the plurality of light emitting diodes overlaps an area between the first upper assembly electrode and the second upper assembly electrode and an area between the first lower assembly electrode and the second lower assembly electrode.

6. The display device according to claim 4, wherein the first upper assembly electrode includes:

a first conductive layer disposed on the passivation layer; and a first clad layer which covers the first conductive layer, wherein the second upper assembly electrode includes a second conductive layer disposed on the passivation layer and a second clad layer which covers the second conductive layer, and the first upper assembly electrode and the second upper assembly electrode are symmetrically disposed.

7. The display device according to claim 6, wherein at least a part of the second clad layer protrudes toward the plurality of light emitting diodes to overlap the first lower assembly electrode.

8. The display device according to claim 7, wherein an interval between the first clad layer and the second clad layer in an area overlapping the plurality of light emitting diodes is smaller than an interval between the first clad layer and the second clad layer in an area which does not overlap the plurality of light emitting diodes.

9. The display device according to claim 8, wherein an interval between the first clad layer and the second clad layer is constant in an area overlapping the plurality of light emitting diodes and the interval between the first clad layer and the second clad layer gradually increases as a distance from the plurality of light emitting diodes increases.

10. The display device according to claim 8, wherein an interval between the first clad layer and the second clad layer is constant in the area overlapping the plurality of light emitting diodes and the interval between the first clad layer and the second clad layer is constant in the area which does not overlap the plurality of light emitting diodes.

* * * * *